United States Patent [19]

Wermuth et al.

[11] 4,034,308

[45] July 5, 1977

[54] AMPLIFIER WITH CONTROLLABLE TRANSMISSION FACTOR AND SWITCHABLE CONTROL CHARACTERISTIC

[75] Inventors: Jürgen Wermuth, Stederdorf; Gerhard Dickopp; Ernst Schröder, both of Hannover, all of Germany

[73] Assignee: Licentia Patent-Verwaltungs-G.m.b.H., Frankfurt am Main, Germany

[22] Filed: July 6, 1976

[21] Appl. No.: 703,119

[52] U.S. Cl. .................................. 330/86; 330/51; 330/103; 330/109
[51] Int. Cl.² ......................................... H03F 1/36
[58] Field of Search ............. 330/9, 35, 51, 85, 86, 330/103, 109; 333/14

[56] References Cited

UNITED STATES PATENTS 3,815,039   6/1974   Fujisawa et al. ..................... 330/51

*Primary Examiner*—Rudolph V. Rolinec
*Assistant Examiner*—Lawrence J. Dahl
*Attorney, Agent, or Firm*—Spencer & Kaye

[57] ABSTRACT

An amplifier circuit whose gain bears a desired relation to a control voltage, including a differential amplifier, a plurality of impedances interconnected between the amplifier terminals and switches interconnected with the impedances and switchable between two states which create two impedance configurations that give the circuit mutually complementary gain vs. control voltage control characteristics.

4 Claims, 3 Drawing Figures

AMPLIFIER WITH CONTROLLABLE TRANSMISSION FACTOR AND SWITCHABLE CONTROL CHARACTERISTIC

BACKGROUND OF THE INVENTION

The present invention relates to an amplifier whose transmission factor, i.e. gain or attenuation factor, can be controlled by means of a control voltage and which can be switched between two operating states having complementary control characteristics.

Such amplifiers are required, for example, in signal amplitude compression-expansion, or compander, systems for noise suppression as they are disclosed in German Offenlegungsschrift [Laid-Open Application] No. 22 18 823, as well as in German Auslegeschrift [Published Application] No. 24 06 258 and corresponding U.S. application Ser. No. 543,931, filed Jan. 24th, 1975. These systems require an amplifier which during dynamic compression has a certain control characteristic corresponding to a certain dependence of the amplitude of its output signals or its gain, on a control voltage, and during dynamic expansion has a control characteristic corresponding to a complementary dependence.

German Offenlegungsschrift No. 22 18 823 describes an amplifier which can be switched between two operating states and in which a variable gain is effected by means of a controllable impedance which, in the one operating state of the amplifier, is connected to a feedback path of the amplifier and, in the other operating state, is connected to the input of the amplifier.

A drawback inherently present in simple compander systems, i.e. modulation of the noise components in dependence on low frequency useful signals, has led to the requirement, described in Funktechnik, 1973, pages 55–57, particularly FIG. 6, for a shift of the lower frequency limit of the circuit effecting the dynamic compression or expansion, in dependence on the amplitude of the useful signals, toward higher frequency values, while keeping the resulting characteristics as congruent as possible.

In the amplifier disclosed in German Offenlegungsschrift No. 22 18 823, whose control input receives a control voltage derived from the useful signal, a capacitance is connected in series with the controllable impedance so that a slight dependence on the amplitude of the useful signals results for the lower frequency limit of the amplifier. However, the shift of the lower frequency limit obtained in this way is limited to a narrow range. Moreover, in the known circuit the amplitude of the amplifier output signals in the transmitting range is also changed in an undesirable manner.

SUMMARY OF THE INVENTION

It is an object of the present invention to provide an amplifier which can be switched with respect to its control characteristic and in which an accurate parallel shift of the frequency characteristics is possible in a simple manner by the addition of frequency dependent components.

The invention is based on a circuit including a differential amplifier having a noninverting input and an inverting input, the circuit being arranged to cause the amplifier to have a transmission factor which is a function of the value of a control voltage, and being switchable between first and second operating states in which the amplifier has mutually complementary control characteristics, the circuit including a voltage-controllable first impedance having a control input connected to receive the control voltage and arranged to assume an impedance value which is a function of the value of the control voltage, the first impedance being connected in a feedback path of the amplifier when the circuit is in its first operating state. The objects of the invention are achieved by supplementing such a circuit with: a second impedance; connection elements connecting the first and second impedances in series between the output of the amplifier and a point at the circuit reference potential; a third impedance connected between the output and inverting input of the amplifier, a fourth impedance having an impedance value equal to that of the third impedance and having one side connected to the noninverting input of the amplifier; and switching elements connected for switching the circuit between its operating states, the switching elements having a first switching state corresponding to the first operating state, in which the point of connection between the first and second impedances is connected to the amplifier inverting input and the voltage at the output of the amplifier constitutes the output voltage of the circuit, and a second switching state corresponding to the second operating state, in which the point of connection between the first and second impedances is connected to the other side of the fourth impedance and the voltage at that connection point constitutes the output voltage of the circuit. To attain an accurate parallel shift of the frequency characteristics according to the invention, it is merely necessary to constitute the second impedance by a capacitor and to constitute the first variable impedance by a parallel arrangement of a further capacitor and an electronically controllable resistor.

DESCRIPTION OF THE PREFERRED EMBODIMENTS

Figure 1:
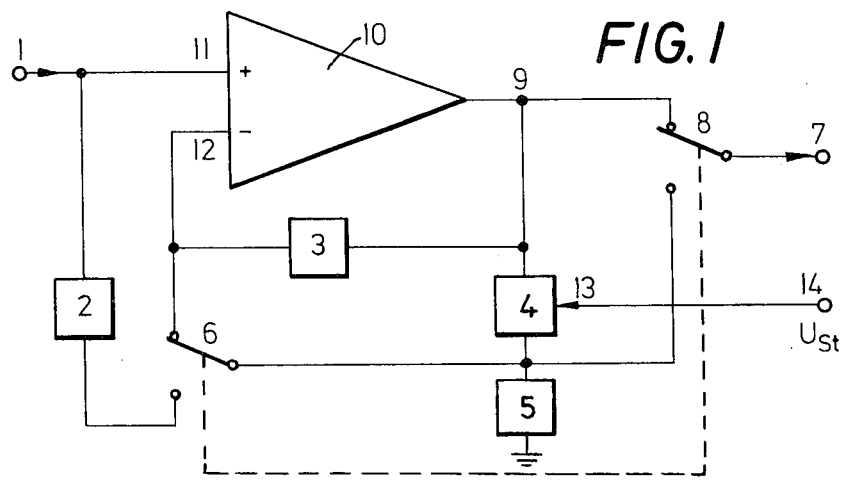
FIG. 1 is a basic circuit diagram of a preferred embodiment of an amplifier according to the present invention.

FIG. 1 shows an amplifier circuit whose control characteristic can be switched to alter the function defining the dependence of the amplifier output voltage on a control voltage $U_{st}$ present at terminal 14 by means of the two switches 6 and 8 coupled to switch simultaneously. Switches 6 and 8 can be designed as switching contacts.

The input signals, e.g. low frequency signals in a compander system, present at input terminal 1 are fed to the noninverting input 11 of a differential amplifier 10 whose output 9 is connected, in the illustrated position of switch 8, to the output terminal 7. From output 9 of differential amplifier 10 a feedback path including an impedance 3 leads back to the inverting input 12 of differential amplifier 10. In the illustrated position of switch 6, a further, controllable, impedance 4 is connected in parallel with impedance 3, the impedance value of impedance 4 being a function of voltage applied to its control input 13, and this control input being connected to terminal 14 to receive the control voltage $U_{St}$.

The inverting input 12 of differential amplifier 10 is also connected to ground, via switch 6 and a third impedance 5, so that a change in the value of impedance 4 influences the feedback and thus the gain of differential amplifier 10. In the illustrated position of switches 6 and 8, an increase in the impedance value of element 4 results in an increase in the gain of differential amplifier 10.

The complex gain $G_1$ of the desired circuit can be described by the following equation:

$$G_1 = \left|\frac{U_{out}}{U_{in}}\right| = \left|\frac{U_7}{U_1}\right| = \left|\frac{Z_3 \| Z_4 + Z_5}{Z_5}\right| \quad (1)$$

In this equation, $Z_3$, $Z_4$ and $Z_5$ are the complex impedance values of impedances 3, 4 and 5, respectively. The notation $Z_3 \| Z_4$ signifies the parallel connection relation between impedances 3 and 4. $Z_3 \| Z_4$ is expressed by the following equation:

$$Z_3 \| Z_4 \triangleq \frac{Z_3 \cdot Z_4}{Z_3 + Z_4}$$

If the illustrated circuit is switched by means of switches 6 and 8 into the outer operating state, the differential amplifier 10 constitutes an amplifier which, due to the feedback from output 9 to the inverting input 12 via impedance 3 has a gain of 1 or almost 1. Thus the same signal, with respect to amplitude, appears at output 9 of differential amplifier 10 as at the noninverting input 11. The circuit thus acts as if output 9, and thus one side of impedance 4, were electrically connected directly to the input terminal 1. In this manner the input signal from input terminal 1 travels via the parallel arrangement of a further impedance 2 and impedance 4 to output terminal 7, where impedance 2 has the same value as impedance 3.

In other words: when switches 6 and 8 are switched, the described circuit acts as a voltage divider whose one partial impedance is formed of the parallel connection of impedances 2 and 4 and whose other partial impedance is formed of impedance 5. Consequently for the second operating state of the illustrated circuit there results a gain $G_2$ defined by the following equation:

$$G_2 = \left|\frac{U_{out}}{U_{in}}\right| = \left|\frac{U_7}{U_1}\right| = \left|\frac{Z_5}{Z_2 \| Z_4 + Z_5}\right| \quad (2)$$

In this equation (2), $Z_2$ represents the value of impedance 2. Since impedance 2 has the same value as impedance 3, a comparison of the two equations (1) and (2) shows that the curve of the gain $G_2$ relative to the control voltage $U_{St}$ will be complementary to that of gain $G_1$.

Figure 2:
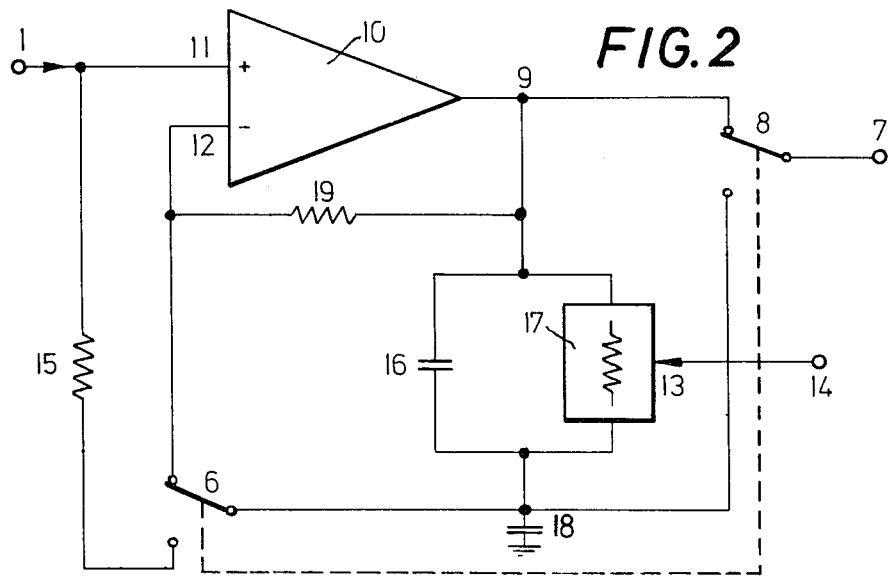
FIG. 2 is a circuit diagram of one specific form of construction of the embodiment of FIG. 1.

FIG. 2 shows a specific embodiment of the amplifier of FIG. 1 in which the capabilities of the circuit are advantageously expanded in a simple manner to enable an accurate parallel shift of the frequency characteristic in the illustrated circuit to be effected in dependence on the above-mentioned control voltage $U_{St}$. Thus, the control voltage $U_{St}$ applied across terminal 14 produces this frequency shift in addition to the required variation in gain.

The circuit according to FIG. 2 is evolved from the basic circuit of FIG. 1 in that the impedance 2 is constituted by an ohmic resistor 15 and the impedance 3 is constituted by an ohmic resistor 19, resistors 15 and 19 having identical resistance values. Moreover, impedance 5 is constituted by a capacitor 18 while impedance 4 is composed of a parallel arrangement of a capacitor 16 and an electronically controllable resistor 17 which is preferably constituted by a field effect transistor having its control electrode connected to terminal 14.

Figure 3:
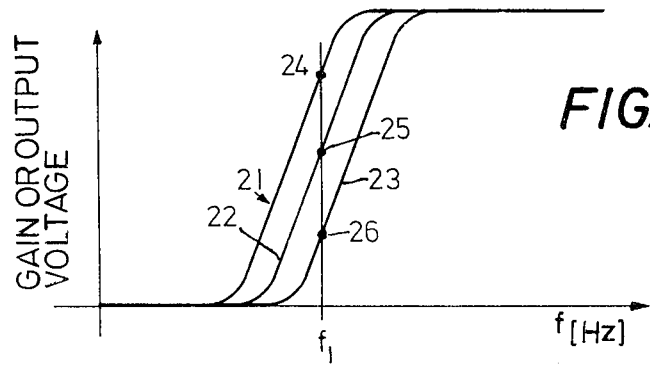
FIG. 3 is a gain or output voltage vs. frequency characteristic diagram illustrating the operation of the amplifier of FIG. 2.

Due to the influence of capacitors 16 and 18, the circuit of FIG. 2, in the illustrated position of switches 6 and 8, produces a frequency characteristic which is represented in the diagram of FIG. 3, for example, by curve 22. As the resistance value of resistor 17 increases, the frequency characteristic will shift toward lower frequencies, i.e. for example into the position of curve 21. Correspondingly, with a decrease in the resistance value of resistor 17 the frequency characteristic will shift toward higher frequencies, i.e. toward curve 23.

The illustration of FIG. 3 shows that the frequency characteristic of the circuit of FIG. 2 can be shifted while remaining exactly parallel to its original orientation without this noticeably changing the form of the curve or the gain amplitude in the principal frequency range.

The change in gain intended to occur simultaneously with a change in the resistance value of resistor 17 in the illustrated circuit at an arbitrarily selected frequency $f_1$ is measured along the vertical line in FIG. 3. The points of intersection 24, 25 and 26 between that line and curves 21, 22 and 23 show that the amplitude of the amplifier output signals, and thus the gain of amplifier 10, increase as the resistance value of resistor 17 increases, the relative change corresponding to the points of intersection 26, 25 and 24.

It will be understood that the above description of the present invention is suscepible to various modifications, changes and adaptations, and the same are intended to be comprehended within the meaning and range of equivalents of the appended claims.

What is claimed is:

1. In a circuit including a differential amplifier having a noninverting input and an inverting input, the circuit being arranged to cause the amplifier to have a transmission factor which is a function of the value of a control voltage, and being switchable between first and second operating states in which the amplifier has mutually complementary control characteristics, the circuit including voltage-controllable first impedance means having a control input connected to receive the control voltage and arranged to assume an impedance value which is a function of the value of the control voltage, the first impedance means being connected in a feedback path of the amplifier when the circuit is in its first operating state, the improvement wherein said circuit further comprises:

second impedance means;
   connection means connecting said first and second impedance means to one another at a point of connection and connecting said first and second impedance means in series between the output of said amplifier and a point at the circuit reference potential;
   third impedance means connected between the output and inverting input of said amplifier;

fourth impedance means having an impedance value equal to that of said third impedance means and having one side connected to the noninverting input of said amplifier; and switching means connected for switching said circuit between its said operating states, said switching means having a first switching state corresponding to said first operating state, in which the point of connection between said first and second impedance means is connected to said amplifier inverting input and the voltage at the output of said amplifier constitutes the output voltage of said circuit, and a second switching state corresponding to said second operating state, in which the point of connection between said first and second impedance means is connected to the other side of said fourth impedance means and the voltage at that connection point constitutes the output voltage of said circuit.

2. An arrangement as defined in claim 1 wherein said third and fourth impedance means each comprise an ohmic resistor and have equal resistance values.

3. An arrangement as defined in claim 2 wherein said first impedance means comprises an electronically controllable resistor, the control voltage being supplied to said controllable resistor, said second impedance means comprises a capacitor, and said arrangement further comprises a further capacitor connected in parallel with said electronically controllable resistor.

4. An arrangement as defined in claim 1 wherein said first impedance means comprises an electronically controllable resistor, the control voltage being supplied to said controllable resistor, said second impedance means comprises a capacitor, and said arrangement further comprises a further capacitor connected in parallel with said electronically controllable resistor.

* * * * *